United States Patent
Classson et al.

(10) Patent No.: US 6,732,321 B2
(45) Date of Patent: May 4, 2004

(54) METHOD, APPARATUS, AND ARTICLE OF MANUFACTURE FOR ERROR DETECTION AND CHANNEL MANAGEMENT IN A COMMUNICATION SYSTEM

(75) Inventors: Brian K. Classon, Palatine, IL (US); Joseph M. Nowack, Buffalo Grove, IL (US); John C. Johnson, Spring Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 595 days.

(21) Appl. No.: 09/818,428

(22) Filed: Mar. 27, 2001

(65) Prior Publication Data

US 2002/0174376 A1 Nov. 21, 2002

(51) Int. Cl.$^7$ .................... H03M 13/35; H03M 13/45
(52) U.S. Cl. .................... 714/774; 714/780; 714/794
(58) Field of Search ................. 714/774, 780, 714/794

(56) References Cited

U.S. PATENT DOCUMENTS

| | | | | |
|---|---|---|---|---|
| 5,229,767 A | | 7/1993 | Winter et al. | |
| 5,502,713 A | * | 3/1996 | Lagerqvist et al. | 370/252 |
| 5,671,255 A | | 9/1997 | Wang et al. | |
| 5,751,725 A | * | 5/1998 | Chen | 714/708 |
| 6,141,781 A | * | 10/2000 | Mueller | 714/722 |
| 6,170,073 B1 | * | 1/2001 | Jarvinen et al. | 714/758 |
| 6,298,084 B1 | * | 10/2001 | Vinggaard et al. | 375/224 |

* cited by examiner

Primary Examiner—Stephen M. Baker
(74) Attorney, Agent, or Firm—Kenneth A. Haas

(57) ABSTRACT

A weighting device utilizes soft reliability values and class weighting factors to detect errors in digitized information. The soft reliability values can be provided by a decoder that processes the information according to a predetermined coding scheme. Bits representing the encoded information are classified accorded to classes defined by a bit sensitivity analysis. The bit sensitivity analysis can be based on subjective and/or objective criteria. As incoming bits are received by the weighting device, they are classified and class reliability values are computed for each class based on the soft reliability values. The class reliability values are then weighted to produce weighted class reliability values. Error concealment algorithms, coding rate determination, and coding rate requests can be activated based on the weighted class reliability values.

25 Claims, 7 Drawing Sheets

| CLASS | NUMBER OF BITS | WEIGHTING FACTOR |
|---|---|---|
| 1 | 16 | 1 |
| 2 | 11 | 1.5 |
| 3 | 21 | 4 |
| 4 | 55 | 0 |

FIG.5A

| BIT | COMMENTS |
|---|---|
| | CLASS 1 |
| 10 | EXPLOSIVE BURSTS OF ENERGY |
| 11 | EXPLOSIVE BURSTS OF ENERGY |
| 0 | PITCH INVERSION |
| 1 | PITCH INVERSION, LOUD BURST |
| 29 | MUTED, MANY LOUD ENERGY BURSTS |
| 36 | LARGE ENERGY FLUCTUATIONS |
| 15 | LOUD, CHOPPY, TOMMY GUN |
| 12 | ENERGY MODULATION |
| 3 | PITCH INVERSION, BOINGS BACKGROUND DISTORTED DUMF TONES |
| 2 | PITCH INVERSION, MONOTONIC, CHANGED "THE" TO "A"! |
| 4 | PITCH MODULATION, WARBLING |
| 5 | PITCH MODULATION, WARBLING |
| 28 | VERY MUTED, BURSTS |
| 49 | LOUD ENERGY MOD AND THUMPING, NASAL |
| 30 | MUTED, LOUD ENERGY BURSTS |
| 31 | MUTED, LOUD ENERGY BURSTS |
| | CLASS 2 |
| 16 | FLUTTERING, CHOPPY, TOMMY GUN |
| 50 | ENERGY MOD, PARTIAL MUTES, THUMPING, NASAL |
| 37 | ENERGY FLUCTUATIONS, MUTED AND NASAL MALE |
| 38 | ENERGY FLUCTUATIONS, MUTED AND NASAL MALE |
| 63 | HOLLOW, UNNATURAL VOICE |
| 42 | HOLLOW, UNNATURAL VOICE |
| 43 | SOME LOUD CHANGES; HOLLOW |
| 6 | WARBLING, HOARSE |
| 51 | ENERGY CHANGES, TWANG, UNNATURAL VOICE |
| 64 | HOLLOW, UNNATURAL VOICE |
| 65 | HOLLOW, UNNATURAL VOICE |
| | CLASS 3 |
| 32 | SOME PARTIAL MUTES, HIGH-PASS FILTERED |
| 7 | WARBLING, HOARSE |
| 8 | WARBLING, HOARSE |
| 9 | WARBLING, HOARSE |
| 70 | LOW FREQUENCY RESONANCE |
| 73 | RASPY, HOARSE, WHISTLING |
| 13 | RAPID ENERGY FLUCTUATIONS |
| 17 | TAPPING/THUMPING MICROPHONE, SCRATCHY |
| 20 | STATIC, CLICKING, BUZZ |
| 21 | STATIC, CLICKING, BUZZ |
| 74 | RASPY, HOARSE, WHISTLING |
| 24 | STATIC, CLICKING, BUZZ, METAL SHEETS ... |
| 25 | STATIC, CLICKING, BUZZ, METAL SHEETS ... |
| 83 | UNNATURAL, SLURRED, SQUEAKING |
| 84 | UNNATURAL, SLURRED, SQUEAKING |
| 85 | UNNATURAL, SLURRED, SQUEAKING |
| 33 | SOME ENERGY MODULATION, NASAL |

FIG. 5B

| | | |
|---|---|---|
| 34 | SOME ENERGY MODULATION, NASAL | ← 100 |
| 35 | SOME ENERGY MODULATION, NASAL | |
| 39 | SOME ENERGY MODULATION | |
| 40 | SOME ENERGY MODULATION | |
| | CLASS 4 | |
| 44 | HOARSE AND NASAL | |
| 45 | HOARSE AND NASAL | |
| 66 | NASAL/HOARSE | |
| 67 | NASAL/HOARSE | |
| 68 | NASAL/HOARSE | |
| 69 | NASAL/HOARSE | |
| 71 | NASAL/HOARSE | |
| 72 | NASAL/HOARSE | |
| 93 | HOARSE | |
| 46 | SLIGHTLY NASAL/HOARSE | |
| 47 | SLIGHTLY NASAL/HOARSE | |
| 48 | SLIGHTLY NASAL/HOARSE | |
| 52 | SOME RUMBLING | |
| 53 | SOME RUMBLING | |
| 54 | SOME RUMBLING | |
| 55 | SOME RUMBLING | |
| 56 | SOME RUMBLING | |
| 57 | SLIGHTLY HOARSE | |
| 58 | SLIGHTLY HOARSE | |
| 59 | SLIGHTLY HOARSE | |
| 60 | SLIGHTLY HOARSE | |
| 61 | SLIGHTLY HOARSE | |
| 62 | SLIGHTLY HOARSE | |
| 75 | SLIGHTLY HOARSE, SOMETIMES HOLLOW | |
| 76 | SLIGHTLY HOARSE, SOMETIMES HOLLOW | |
| 77 | SLIGHTLY HOARSE, SOMETIMES HOLLOW | |
| 78 | SLIGHTLY HOARSE, SOMETIMES HOLLOW | |
| 79 | SLIGHTLY HOARSE, SOMETIMES HOLLOW | |
| 80 | SLIGHTLY HOARSE, SOMETIMES HOLLOW | |
| 81 | SLIGHTLY HOARSE | |
| 82 | SLIGHTLY HOARSE | |
| 41 | SLIGHT ENERGY FLUCTUATION FOR ONE WORD | |
| 14 | SLIGHT ENERGY FLUCTUATIONS | |
| 18 | SLIGHT THUMPING | |
| 22 | ONE WARBLE | |
| 26 | ONE WARBLE | |
| 86 | SLIGHTLY HOARSE | |
| 87 | SLIGHTLY HOARSE | |
| 88 | SLIGHTLY HOARSE | |
| 89 | SLIGHTLY HOARSE | |
| 90 | SLIGHTLY HOARSE | |
| 91 | SLIGHTLY HOARSE | |
| 92 | SLIGHTLY HOARSE | |

| 94 | SLIGHT ENERGY FLUCTUATION FOR ONE WORD |
| 95 | SLIGHT ENERGY FLUCTUATIONS |
| 96 | SLIGHT THUMPING |
| 97 | ONE WARBLE |
| 98 | ONE WARBLE |
| 99 | SLIGHTLY HOARSE |
| 100 | SLIGHTLY HOARSE |
| 101 | SLIGHTLY HOARSE |
| 102 | SLIGHTLY HOARSE |
| 19 | CLEAN |
| 23 | CLEAN |
| 27 | CLEAN |

*FIG.5C*

| CHANNEL MODE | SOURCE CODING BIT-RATE, SPEECH |
|---|---|
| TCH/AFS | 12.20 KBIT/S (GSM EFR)<br>10.2 KBIT/S<br>7.95 KBIT/S<br>7.40 KBIT/S (DAMPS EFR)<br>6.70 KBIT/S<br>5.90 KBIT/S<br>5.15 KBIT/S<br>4.75 KBIT/S |
| TCH/AHS | 7.95 KBIT/S<br>7.40 KBIT/S (DAMPS EFR)<br>6.70 KBIT/S<br>5.90 KBIT/S<br>5.15 KBIT/S<br>4.75 KBIT/S |

*FIG.6*

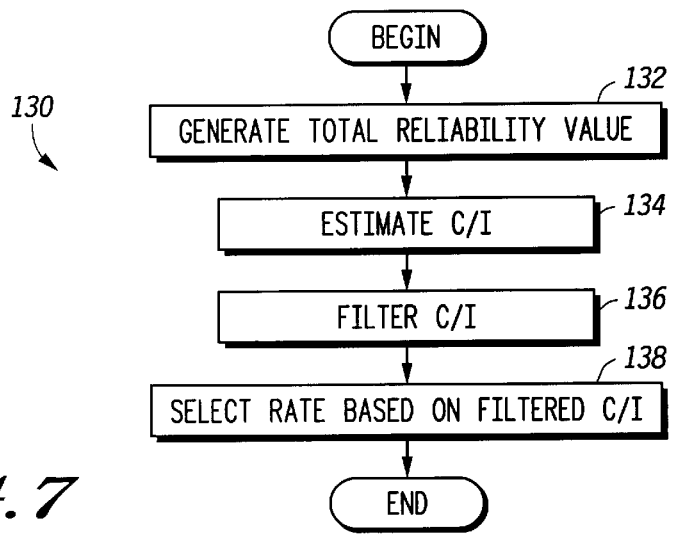

| MODE | SPEECH CODER RATE (BPS) | CHANNEL CODER RATE | NUMBER STATES IN CHANNEL CODER | PUNCTURING MATRIX USED IN CHANNEL CODER |
|---|---|---|---|---|
| 0 | 8550 | 1/2 | 64 | 1111111111111111111111111111111111111111111111111111111111111111111111111111111111 1010101010101011111111111111111111111111111111111111111111111111111111111010101 |
| 1 | 10500 | 1/2 | 16 | 11111111111111111111111111111111111111111111 1111111111111111111111111111111111110101 |
| 2 | 12150 | 1/2 | 16 | 111111111111111111111111111111111111111111111111 101010101010101010101010101010101010101010101010101010101010101010101010101 |
| 3 | 13350 | 1/2 | 16 | 1111111111111111111111...1111111111111111111111 101010101010101010...101010101010101010101010 |
| 4 | 14150 | 1/2 | 16 | 1111111111111111111111...1111111111111111111111 1000100010001000100010001000...101010101010101010101010101010101010101010 |
| 5 | 15950 | 1/2 | 16 | 1111111111111111111111...1111111111111111111111 100010001000100010001000...10001000100010001000100010001000100010 |
| 11 | 12150 | 1/2 | 16 | 11111111111111111111111111111111111111111111 10101010101010101010101011111111111111110101 |

150

| MODE C/I (dB) | 0 | 1 | 2 | 3 | 4 | 5 | 11 |
|---|---|---|---|---|---|---|---|
| 1 | 160 | 121 | −14 | −3 | −14 | −19 | 49 |
| 4 | 528 | 407 | 201 | 210 | 202 | 92 | 309 |
| 7 | 896 | 692 | 416 | 422 | 418 | 202 | 569 |
| 10 | 1264 | 955 | 675 | 686 | 682 | 369 | 859 |
| 13 | 1502 | 1115 | 889 | 892 | 893 | 513 | 1053 |
| 16 | 1657 | 1206 | 1061 | 1065 | 1068 | 631 | 1177 |
| 19 | 1745 | 1254 | 1184 | 1187 | 1187 | 708 | 1242 |
| 22 | 1792 | 1280 | 1280 | 1280 | 1280 | 768 | 1280 |

| MODE | THRESHOLD TO MOVE UP (dB) | THRESHOLD TO MOVE DOWN (dB) |
|---|---|---|
| 4 | − | 15 |
| 2 | 17 | 12 |
| 1 | 14 | 9 |
| 0 | 11 | − |

US 6,732,321 B2

METHOD, APPARATUS, AND ARTICLE OF MANUFACTURE FOR ERROR DETECTION AND CHANNEL MANAGEMENT IN A COMMUNICATION SYSTEM

TECHNICAL FIELD OF THE INVENTION

The present invention relates generally to digital error detection/correction techniques and rate determination techniques, and in particular to data error protection based on the perceptual significance of data symbols.

BACKGROUND OF THE INVENTION

In some communication systems employing digital coding techniques, error detection relies on window error detectors (WEDs). A WED takes a single window (i.e., subset) of bits in a frame and declares a frame error if the WED detects an error in those bits. Generally, the WED works in conjunction with a decoder, such as a Viterbi decoder, to generate a soft reliability value for only the decoded information bits in the window. Bits with large soft values are considered reliable, and those with small or zero soft values are considered unreliable. The WED declares a frame error if the minimum reliability within the window is less than a threshold. All bits within the window are treated similarly.

In communication systems carrying voice, multiple errors for bits outside the window are likely to cause a perceptual degradation in speech quality and warrant some form of error concealment, but these errors may be missed by a conventional WED. Moreover, the WED is limited in the type of forward error correction (FEC) coding used (convolutional code) and the method of soft value generation. The WED treats all of the window bits equally when determining the quality of the decoded frame and when invoking an error concealment algorithm. Treating the window bits equally can limit the effectiveness of error concealment, and can also limit the method of estimating the recent channel conditions, especially if a sequence of speech frames includes frames having different coding rates, such as in communication systems employing adaptive multi-rate (AMR) GSM.

Some digital communication systems use multiple coding rates to transport information. In such systems, the coding rate should be accurately determined or selected in order to ensure reliable, relatively error-free communication. For rate determination, some known schemes rely on (1) received soft reliability values, (2) Viterbi decoder metric values during the decoding process (e.g., total metric, Q-bits) (3) decoded information bits (e.g., CRC check, symbol error rate), or combinations of these (e.g., symbol matching score). Although these known rate determination methods produce acceptable results in some circumstances, there is an opportunity for improving their accuracy and reliability. Accordingly, there is a need for an improved method and apparatus for detecting errors in digitally transmitted information and for accurately determining and/or selecting channel coding rates.

BRIEF DESCRIPTION OF THE DRAWINGS

FIGS. 5A–B shows a table showing the results of an exemplary bit sensitivity analysis;

FIG. 6 shows a table of AMR speech coder rates for the channel coding schemes of GSM;

FIG. 7 is a flow chart illustrating a method of coder rate selection in accordance with another embodiment of the present invention;

FIG. 8 shows a table illustrating characteristics for a candidate AMR-WB speech coder standard;

DETAILED DESCRIPTION OF THE PRESENTLY PREFERRED EMBODIMENT(S)

The present invention can be used in any communication system, and specifically, in systems that transport information represented by symbols (e.g. bits) having differing perceptual importance. Examples of such systems include many wireline and wireless communication systems, such as iDEN, GSM, satellite communications and advanced generation cellular systems.

The invention can provide speech quality and rate determination improvements to GSM and adaptive multi-rate (AMR) systems. It may also provide capacity and rate determination improvements to DS-CDMA systems, such as IS-95. The invention can improve speech quality for a fixed rate speech coder in channels with errors (e.g., iDEN, Half- or Full-Rate GSM).

Also, the invention can improve speech quality for variable rate speech coders in channels with errors (e.g., AMR in GSM). In addition to improving speech quality for a given rate, the receiver may be able to optimize the decoded speech quality for scenarios in which: (a) the rate determination mechanism is inadequate, (b) the air interface error detection method (e.g., CRC) is inadequate, or (c) the received speech frames each have different coding rates, thus complicating error concealment algorithms.

The description given below uses encoded speech data for illustration purposes. The invention, however, may apply to any information, such as audio, video, data and the like.

Figure 1:
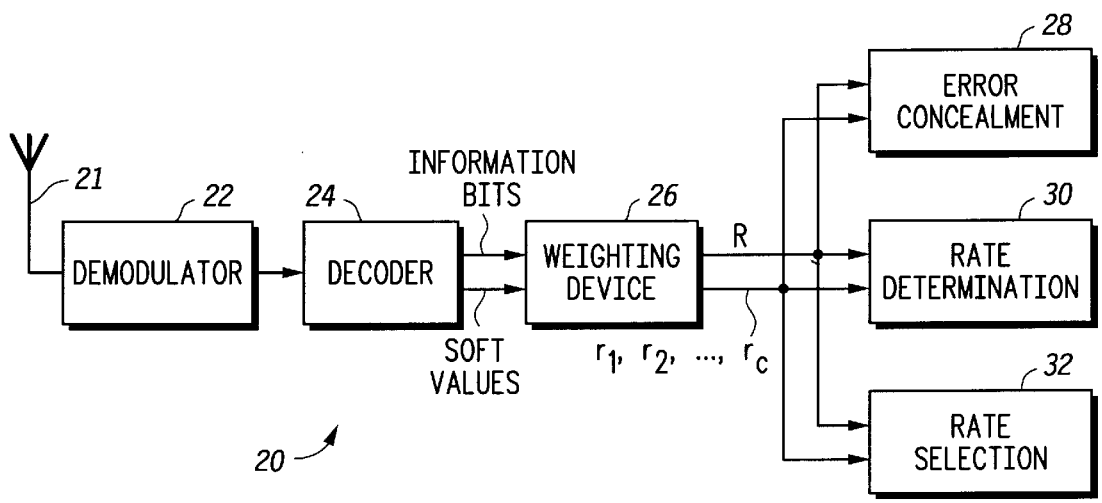
FIG. 1 is a block diagram illustrating a system in accordance with an embodiment of the present invention.

Turning now to the drawings, and in particular to FIG. 1, there is illustrated an apparatus 20 in accordance with an embodiment of the present invention. The apparatus 20 can be included in a receiver used in a wireless communication system. The apparatus includes an antenna 21, a radio frequency (RF) demodulator 22, a decoder 24, a weighting device 26, an error concealment procedure 28, a rate determination procedure 30, and a rate selection procedure 32.

The demodulator 22 can be any commercially-available RF demodulator for outputting digitized information symbols in response to receiving data modulated on an RF carrier using any suitable conventional modulation technique. In addition to outputting demodulated information symbols, the demodulator 22 can also generate soft values indicating the reliability of corresponding symbols.

The decoder 24 can be any suitable channel decoder for outputting decoded information and soft reliability values according to a predetermined coding scheme. The output of the decoder 24 includes information symbols, such as bits, representing decoded information and soft values representing the reliability of corresponding output information symbols. The decoder 24 can implement any suitable channel coding algorithm, such as a soft output Viterbi algorithm (SOVA), modified SOVA, MAP or BCJR, or other decoding algorithm.

The weighting device 26 generates a total reliability value R and a reliability vector $r=(r_1, r_2, \ldots, r_c)$. Each element in the reliability vector represents a class reliability value. The weighting device 26 generates the total reliability value and the reliability vector based on the information symbols and soft reliability values from the decoder 24.

Figures 9, 10, 11:
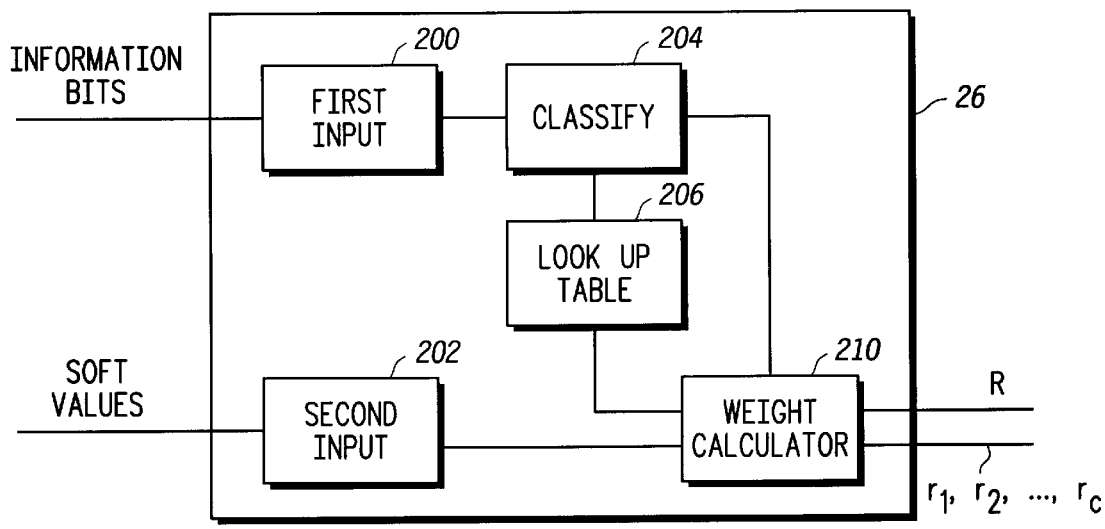
FIG. 9 shows a table for estimating C/I levels based on weighted reliability values from the weighting device of FIG. 1.
FIG. 10 shows a table of active codec set (ACS) thresholds.
FIG. 11 is a block diagram illustrating details of the weighting device of FIG. 1.

As shown in FIG. 11, the weighting device 26 includes a first input 200 for receiving the information symbols from the decoder 24 and a second input 202 for receiving the reliability values corresponding to the symbols. The device 26 also includes a classifier 204, a look-up table 206, and a weight calculator 210. The classifier 204 associates each of the incoming information symbols with at least one of a plurality of predetermined classes. The look-up table 206 stores weighting factors corresponding to each of the classes. Based on the class of an incoming symbol, a corresponding weight factor is retrieved from the look-up table 206. The weight calculator 210 determines a plurality of class reliability values and then weights each class reliability value with a corresponding weight factor from the look-up table 206 to generate a plurality of weighted class reliability values. The weighted class reliability values form the basis for the total reliability value R and the reliability vector r.

The apparatus 20 can include one or more procedures for performing channel management actions based on the output of the weighting device 26. In the example shown, the error concealment procedure 28 can include circuitry and/or software programs for reducing the effects of errors occurring in the information symbols.

The rate determination procedure 30 is used in multi-rate systems and can include circuitry and/or software programs for determining the coding rate of the decoder 24.

The rate selection procedure 32 includes circuitry and/or software programs for selecting a coding rate in a multi-rate system. An example of a rate selection process is described in more detail below.

The apparatus 20 can be implemented using various hardware and software components, or combinations thereof. For example, the apparatus 20 can be built using one or more integrated circuits, such as application specific integrated circuits (ASICs), or a combination of commercially-available hardware components and microprocessor(s), where the microprocessor executes one or more software programs for performing the functions of the apparatus 20 as disclosed herein.

Figure 2:
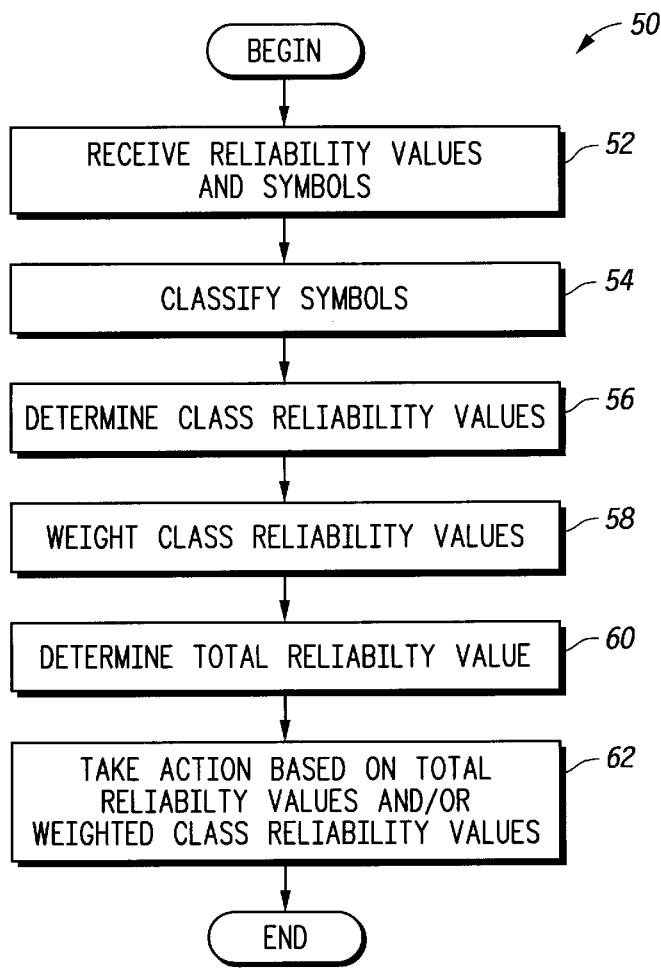
FIG. 2 shows a flow chart illustrating the operation of the system of FIG. 1.

FIG. 2 shows a flow chart 50 describing the operation of the apparatus 20 of FIG. 1. In step 52, the weighting device 26 receives reliability values and information symbols from the decoder 24. The symbols can be bits.

In step 54, the weighting device 26 classifies the symbols (bits) according to a predefined classification scheme. The classification scheme is created using a bit sensitivity analysis. Details of the bit sensitivity analysis are described in connection with FIG. 3. The sensitivity analysis can be extended over an entire frame or block, rather than a smaller window of bits, to detect the effects of multiple bit errors per frame or block.

In accordance with an exemplary embodiment of the present invention, for each coding rate, the information bits are assigned into C classes, where C is an integer. The bits in each class have a similar perceptual value, with class 1 being considered the most significant perceptually, and class C being considered the least significant perceptually. The number of classes is less than or equal to the total number of bits in a frame or block defined by the coding scheme.

At the decoder 24, each bit is assigned a soft reliability value, $L_i$, where $L_i \geq 0$. The soft reliability value can be the output of a soft output channel decoder included in the decoder 24, such as a soft output Viterbi algorithm (SOVA), modified SOVA, MAP or BCJR, or other decoding algorithm. Different methods of forward error correction (FEC) coding (block, convolutional, or the like) can be used as long as soft values are produced for the decoded information bits.

FIG. 1 shows separate decoder outputs for information bits and soft values. Alternatively, the decoder 24 can output signed soft values, where the signs of the soft values represent the values of the corresponding information bits. Using this approach, it is not necessary to separately output the information bits.

Although FIG. 1 shows the channel decoder 24, the invention can apply to information bits that are not coded by an FEC algorithm or other coding scheme. With unencoded bits, soft reliability values can be derived from soft output values from the demodulator 22.

In step 56, a plurality of class reliability values are determined. To accomplish this, the reliability values associated with the bits in each class can be combined to form a respective class reliability value. In other words, bits in the jth class are combined to form a class reliability value, $a_j$, where j is an integer. The particular method of determining a class reliability value depends on the application, but could include setting the class reliability value to be the mean of the reliability values in a class, the median reliability value of a class, or the minimum reliability value of a class, and so on.

In step 58, each of the class reliability values is weighted, whereby generating a plurality of weighted class reliability values. Each class j is assigned a weighting factor $w_j$, where $W_j \geq 0$. The weighting factors can be predetermined or adaptively selected and are stored in the look-up table 206. A greater weighting factor indicates that a class is more perceptually significant. A weighting factor of zero effectively excludes a class.

In step 60, the total reliability value R can be computed as the sum of class reliability functions, $$R = \sum_{j=1}^{C} r_j = \sum_{j=1}^{C} w_j a_j. \qquad (1)$$

In general, the reliability vector $r=(r_1, r_2, \ldots, r_c)$ can be the input to an error detection device or an error concealment device or algorithm. A weighting factor of zero effectively excludes the class from the total reliability value.

As an alternative to the summation operation of Equation (1), other operations can be used, such as a series multiplication, minimum determination, maximum determination, and so on. For each operation, there exists a corresponding weighting factor which can be used to exclude a class from the total reliability value.

In step 62, a channel management action is taken based on either the total reliability value R or the reliability vector r.

The channel management action can include error detection, error concealment, coding rate determination, coding rate selection, or various other actions for configuring the transfer of information over a communication channel.

In one embodiment of the invention, the value of R is used to trigger and control the error concealment algorithm 28. The error concealment algorithm 28 could, for example, mute the amplitude of the resulting synthesized speech signal in proportion to the value of R. Alternatively, if R is less than a threshold, the corresponding frame or block of information can be declared to be in error. The threshold can be predetermined or adaptively selected, based on criteria such as channel conditions. Using a threshold comparison, the error concealment process 28 can use a previously received good frame to synthesize the speech instead of the corrupted frame.

The apparatus 20 and method described above provide unequal error protection and/or error detection based on the perceptual weighting of information symbols. The apparatus 20 and method can be used to augment error detection already present in a receiver's air interface. In addition, the apparatus 20 and method are applicable to any channel coding scheme that can generate the soft reliability values. The apparatus 20 and method can be used to bypass known rate determination procedures for IS-95. Also, the apparatus 20 and method are applicable to receivers using soft input soft output (SISO-type) decoders.

I. Bit Sensitivity Analysis

The bit sensitivity analysis is performed for a given coding scheme to create classes of speech encoded bits. Each class defines a group of encoded bits having a particular perceptual importance. The bit sensitivity analysis exploits the fact that, with a particular coding algorithm, some bits of a speech/data frame are more perceptually important than others. For example, a single bit error in an "energy" parameter—within a coded frame could cause a loud sound burst at the receiver which would degrade audio quality, and at worst, would be a potential aural hazard. On the other hand, a bit error in a "residual error" parameter of the same frame may not cause noticeable audio degradation. For these vocoders, error control coding can be applied in an air interface in a manner in which the most sensitive bits, i.e., most perceptually important, get the most error protection while the less sensitive bits get less error protection; hence, the term "unequal error protection".

The error control coding applied at the transmitter can involve unequal error protection methods of error correction, error detection, or both. The receiver, in addition to performing all error protection operations associated with the air interface, can exploit the perceptual importance of the speech bits and provide additional unequal error protection. For example, after error correction is attempted on a received speech frame, if a perceptually important speech bit is detected to be in error, then an error concealment strategy can be invoked (such as substituting a previously received uncorrupted frame). Errors in other less perceptually important bits may not merit inclusion in an error concealment algorithm or may be treated differently by the error concealment algorithm.

Figures 3, 4:
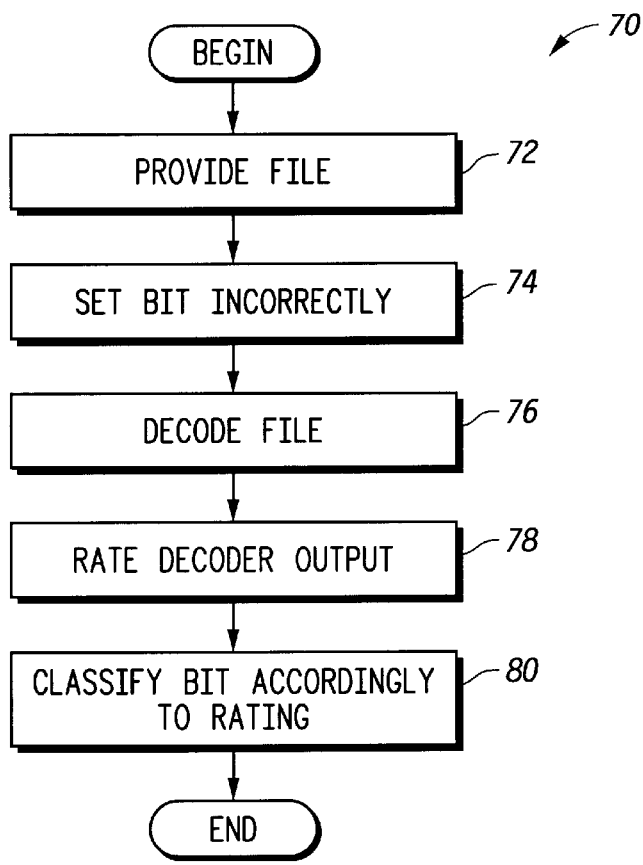
FIG. 3 shows a flow chart of a method of performing a bit sensitivity analysis.
FIG. 4 is a table of exemplary weighting factors usable by the weighting device of FIG. 1.

FIG. 3 shows a flow chart 70 of a method of performing a bit sensitivity analysis. The bit sensitivity analysis can be performed "off-line", in a non-operational mode of the apparatus 20. The results of the analysis can be stored in the apparatus 20 as a look-up table.

In step 72, an encoded test information file is provided. The test file can include a predefined sample of information, such as voice, data video, or the like, encoded using a specified coding scheme. The amount of information in the file can represent a predetermined number of blocks or frames.

In step 74, one or more bits in the test file is set incorrectly to create a data error in the file. This simulates data errors caused during transmission over a communication channel.

In step 76, the corrupted test file is provided to a decoder. The output of the decoder is then rated according to subjective or objective criteria (step 78). The subjective criteria can be how a particular listener or viewer perceives the decoded, corrupted file. The objective criteria can include measurable data quality metrics and other parameters, such as those defined by ITU P.861.

In step 80, the erroneous bit is assigned to a class based on its rating. Erred bits causing a greater degree of degradation are ranked in classes having lower index numbers. FIGS. 5A–B show a table 100 illustrating the results of an exemplary bit sensitivity analysis for a particular vocoding algorithm. Detail of the vocoder are given below in Section II. The table 100 shows four classes, class 1-class 4, of varying perceptual importance, with class 1 including frame bits having the greatest impact on speech quality and class 4 including frame bits having the least impact.

II. Error Detection For Fixed-Rate Coding

This section describes an exemplary embodiment of the invention. In this embodiment, a speech coder having a coding rate of 2289 bits per second (bps) is used for half-rate speech outputs of 103 bits every 45 msec. Two successive blocks are channel encoded using unequal error protection prior to transmission in a 90 msec frame. The unequal error protection is performed as follows. A subjective bit sensitivity analysis is performed to determine the aural impact of a bit error for each of the 103 bits in a block. The bits are ranked and divided into four classes. The results of the bit sensitivity analysis are given in FIGS. 5A–B.

In one exemplary satellite communication system using the above-described speech coder, multiple coding algorithms are employed. The most sensitive bits are always encoded with a Golay code, while the less sensitive bits are encoded with a less-powerful Hamming code, and the least sensitive bits are not encoded. Hence, this is an example of a fixed-rate vocoder with unequal error protection in the transmitter using different block coding algorithms.

At a receiver in the satellite system, a soft-input, soft-output (SISO) Golay decoder processes the Golay codewords, while a SISO Hamming decoder processes the Hamming codewords. The soft-output decoders respectively assign each output bit a soft reliability value. The class reliability value, $a_j$, can be the minimum bit reliability value for the bits in the jth class. The weighting factors for this scheme are given in FIG. 4.

The number of bits in Class 1 at the receiver need not correspond to the number of bits encoded with the most powerful code (i.e., the receiver unequal error protection may be different than the transmitter unequal error protection). A total reliability function R can be computed as the sum of class reliability functions, $$R = \sum_{j=1}^{C} w_j a_j \quad (2)$$

If R is less than a threshold, the decoded frame is declared to be in error and an error concealment algorithm is invoked. The threshold can be set based on a range of soft reliability values that has been determined. With the weighting factors given in FIG. 4, a threshold is picked such that one unreliable bit in Class 1 or several unreliable bits in Class 2 will cause a frame error to be declared. With the thresholds properly chosen and an effective error concealment algorithm, the resulting speech quality can be improved since frames with multiple bit errors, which would have otherwise gone undetected, are now detected.

The invention can also be applied in a DS-CDMA system in a manner similar to that described in connection with the above-described speech coder. Since the multi-rate vocoder outputs speech bits with perceptually different importance, the receiver can use unequal error protection to alter the declaration of a decoded frame error. That is, a bad frame need not be declared if the CRC indicates that there is at least one decoded bit error (as is currently done for full-rate speech). After decoding, if the reliability function R is sufficiently high, the bit (or bits) in error may have very little perceptual importance. The best speech quality would then be obtained by using the decoded speech frame with the bit error(s) rather than invoking an error concealment algorithm for the entire frame. In a power-controlled CDMA system, relaxing the definition of a "bad frame" can reduce the required transmit power, thus reducing system interference and increasing system capacity without sacrificing speech quality. Another method is to retain the original definition of a "bad frame" for power control purposes, but use the reliability function R to control how the speech decoder handles the "bad frame". If R is sufficiently high, the speech frame should be voice synthesized instead of discarded.

III. Rate Determination for Multi-Rate Coding

A. AMR

The Adaptive Multi Rate (AMR) vocoder for GSM provides eight different speech coding rates, one of which is selected by the network to encode speech every 20 msec. The AMR vocoder can be used on a Full-Rate GSM channel (22.8 kbps) and a Half-Rate GSM channel (11.4 kbps) for a total of 14 different channel coding schemes, as shown in FIG. 6. In all cases, a 6-bit CRC is used to detect errors on the perceptually most important speech bits of a frame. Unequal error protection is applied at the air interface of transmitters and receivers in the form of a stronger convolutional code for the most important speech bits and a punctured convolutional code for the less important bits. For some rates, the least important bits are transmitted without coding.

The vocoder rate is transmitted to receivers in-band so that each receiver knows which of the fourteen Viterbi decoders should be used. For the full-rate channel (TCH/AFS), the vocoder rate is sent within the frame as a two-bit parameter that is encoded with an (8,2) block code. For the half-rate channel (TCH/AHS), the vocoder rate is sent as a two-bit parameter that is encoded with a (4,2) block code. The value of the rate is sent every other speech frame, so the rate can only change every other speech frame.

According to GSM Recommendation 05.05, the decoder must not allow an undetected bad frame more frequently than once every 3000 speech frames when random noise is input to the decoder. To achieve such an undetected bad frame rate, the number of CRC bits L should be at least twelve bits ($2^{-L} < 0.00033$). Since AMR uses a 6-bit CRC, it can guard against only one miss in 64 speech frames, so it will need to be augmented by an additional error detection method. Furthermore, the reliable decoding of the speech frames depends on the reliable decoding of the block code that protects the rate information. If the decoding of the block code fails, two consecutive speech frames may be decoded incorrectly.

At a receiver, a soft-decision block decoder attempts to decode the block code and outputs the rate as well as an associated reliability. The invention is applied in a manner similar to the fixed-rate error detection scheme described above in Section I. The SISO convolutional decoder assigns a soft reliability value to at least some of the decoded bits and class reliability values are derived from the bit reliability values, based on a bit sensitivity analysis performed off-line. A total reliability function R is computed according to Equation 2. If R is less than a threshold, the decoded frame is declared to be in error, even if the CRC checks satisfactorily. The threshold can be set to meet the GSM Recommendation 05.05 requirement. In addition, the threshold can be made mode dependent. This is useful if the lowest mode is more likely to experience random noise conditions, and thus, needs more error protection.

The value of R is also input to the error concealment algorithm. In the error concealment algorithm, if the CRC checks but a low value of R is not sufficiently low to trigger a bad frame indication, this could indicate multiple bit errors in speech bits that are not protected by the CRC. In this case, the synthesized speech can be partially muted by a value proportional to R.

The value of R and the status of the CRC check are also input to the rate determination algorithm 30. If the block decoder fails to decode the received rate information, the rate determination algorithm provides a second chance to salvage the next two speech frames. The convolutional decoder attempts to decode the speech at an assumed rate. If the CRC checks and the value of R is sufficiently large, then the decoded speech may be used rather than discarded. In this case, the decoded speech is accepted. If not, the convolutional decoder can try another rate and repeat the process until a speech frame is accepted or until a time-out occurs. Another function of the rate determination algorithm 30 is to detect the cases in which the block decoder erroneously decodes the rate. That is, channel bit errors cause the block decoder to choose the incorrect rate even though the speech bits may be correct. This is likely to occur on the half-rate channel because the most important speech bits are protected with a more powerful code than the (4,2) block code protecting the rate information. In this case, the rate determination algorithm can use the CRC check and the value of R to override the decision of the block decoder, and ultimately determine the correct rate.

B. IS-95

For a multi-rate speech coder (e.g., the Enhanced Variable Rate Codec in IS-95), the transmitted rate of a particular frame is not sent to the receiver, so a rate determination algorithm is needed. Decoding each of the possible rates and using metrics from the decoder to choose the most likely transmitted rate is known to be a very reliable method. In a DS-CDMA system like IS-95, the existing rate determination algorithms, as well as error concealment algorithms treat all bits in the frame as equally important even though some bits of a vocoded speech data frame are perceptually more important than other bits. Accordingly, unequal error protection based on soft values associated with each decoded bit can be used at a receiver for rate determination. Additionally, in a power-controlled CDMA system, unequal error protection can be used in the receiver to adaptively reduce or increase the required transmit power, thus potentially reducing system interference and increasing system capacity.

The multi-rate vocoder used in IS-95 Rate Set 2 can transmit any one of four possible rates every 20 msec frame. The transmitted rate is determined by the degree of voice activity in the speech. For a strongly voiced speech frame, all of the speech bits are checked with a CRC and are convolutionally encoded before transmission. The specific rate is not communicated explicitly to the receiver, hence a rate determination algorithm is needed.

At an IS-95 receiver, a Viterbi decoder decodes at all four rates and the speech decoder decodes one of the rates as determined by the rate determination algorithm 30. If the algorithm 30 is not confident about any of the decodings, a bad frame is declared which invokes the error concealment algorithm 28, as well as influences the power control mechanism.

For rate determination, the application of the invention is an extension of the AMR application, except that the rate is determined exclusively from the CRC and the total reliability value R (i.e., there is no in-band signaling to denote the transmitted rate). To obtain the best performance, all four of the possible rates should be decoded. The resulting CRC checks and four reliability values are then compared to predetermined thresholds to determine the most likely transmitted rate. The reliability values are associated with the decoded speech bits, not the coded sequence. As such, a soft-output decoder is used to generate the reliability values. As an alternative to using all of the decoded bits in a frame, a subset of the bits in the speech frame can have associated reliability values generated, and be used by the methods disclosed herein.

IV. Coding Rate Selection

As described earlier, the weighting device 26 of the present invention produces a total reliability value from a window of soft outputs of a soft output decoder such as a SOVA, MAP, max-log-MAP, or the like for predetermined codes, such as block, convolutional, or the like. The total reliability value can be used for error detection, error concealment, or rate determination as described above. In addition, an alternate embodiment of the invention uses the total reliability value to perform rate selection in a multi-rate system.

One such exemplary multi-rate system is a candidate AMR speech coder standard of GSM. The example AMR system is designed to switch between a set of rates (speech/channel coding combinations) in response to changing channel conditions. The channel conditions are specified in terms of carrier to interference ratio (C/I). The switching algorithm is defined in terms of a set of four modes in an Active Codec Set (ACS) and two sets of thresholds, one set for moving to a higher rate in the ACS and one set for moving to a lower rate in the ACS. The ACS and thresholds can be sent from a base site to mobile subscriber units at call setup.

In addition to the ACS and thresholds defined in the standard, there are additional procedures required for implementing the rate selection process. These include using a state machine to prevent un-necessary changes of the requested codec rate (rate changes are not visible to the decoder until a number of frames later due to interleaving delay), and using a Bad Frame Indicator (BFI) to prevent rate changes when the decoded information is suspect of being unreliable. According to the standard, the requested rate is transmitted by the mobile to the base site, which then transmits at the selected rate.

Part of implementing rate selection is the C/I determination at the mobile. An accurate C/I measurement is necessary for good overall AMR performance. One way to estimate C/I is to use the existing channel decoder and the weighting device 26 disclosed herein to perform rate selection.

The procedure is described in connection with the flow chart 130 of FIG. 7. In step 132, for each frame of data, a total reliability value is generated using the weighting device 26. Next, the total reliability value is used to estimate C/I values on a per frame basis. This can be accomplished by mapping the total reliability value to a lookup table storing estimated C/I values. In step 136, the C/I samples are filtered to generate a filtered C/I estimate. In step 138, the filtered C/I estimate in then used by the mobile subscriber unit to select the coding rate.

An example of this procedure is provided for the candidate AMR-WB (AMR wideband) modes, speech coding rates, and channel coding methods. A table 150 of the characteristics of AMR-WB is given in FIG. 8.

Within a receiver of the candidate AMR-WB system operating at a given channel mode, the weighting device 26 produces a total reliability value based on the minimum absolute reliability value from a window of bits defined by the last eight values output from a max-log-MAP decoder running on a convolutional code trellis. To generate the total reliability value, the weighting device 26 can perform the classification and weighting procedures as disclosed herein.

Next, the C/I value for the given mode is estimated using the total reliability value. FIG. 9 shows a table 160 of the expected total reliability value for each of the modes of the AMR-WB at a given C/I level. C/I levels for 1–22 dB are shown in the left hand column, and modes are identified in the top row. For a given total reliability value (weighted reliability value) and mode, the corresponding C/I value can be interpolated from the table. Note that the table entries for the total reliability value are dependent on the code rate, the number of states in the convolutional code, and the puncturing being performed.

In step 136, the estimated C/I values corresponding to frames are filtered (smoothed) to produce a C/I estimate. Filtering reduces variance in the C/I estimates to reduce the possibility of unnecessary switching between modes. The filter can be either finite impulse response (FIR) or infinite impulse response (IIR).

An example of an IIR filter used to smooth the C/I samples to generate the C/I estimate is:

$$\bar{x}(n)=\bar{x}(n-1)(1-\alpha)+\alpha x(n), \qquad (3)$$

where $\alpha=0.1$ is a leakage factor that controls the smoothing, x represents the value of the C/I estimates, and n is an integer.

In step 138, the filtered estimated C/I ratio is compared to a threshold to determine whether the operational mode, and thus, the coding rate, should be changed. A exemplary table 180 of ACS thresholds for various modes of the candidate AMR-WB system is given in FIG. 10. Referring to the table 180, if, for example, the mobile subscriber unit is currently operating in mode 2, the unit will switch to mode 4 when the estimated C/I ratio exceeds 17 dB, and the unit will switch to mode 1 when the estimated C/I ratio falls below 12 dB. If the threshold comparison indicates that the mode needs to change, the mobile subscriber unit configures itself to operate at the new mode and communicates the mode change to the base site.

While specific embodiments of the present invention have been shown and described, it will be apparent to those skilled in the art that the disclosed invention may be modified in numerous ways and may assume many embodiments other than those specifically set out and described above. Accordingly, the scope of the invention is indicated in the appended claims, and all changes that come within the meaning and range of equivalents are intended to be embraced therein.

What is claimed is:

1. A method of managing a communication channel, comprising:

receiving a plurality of symbols representing information encoded using a predetermined coding scheme;

receiving a plurality of symbol reliability values corresponding to the symbols;

associating each of the symbols with one of a plurality of predetermined classes;

determining a plurality of class reliability values based on the symbol reliability values;

providing a plurality of predetermined weighting factors corresponding to the classes;

weighting each of the class reliability values with a corresponding one of the predetermined weighting factors to generate a plurality of weighted class reliability values; and taking a predetermined action for managing the communication channel based on at least one of the weighted class reliability values.

2. The method of claim 1, wherein the predetermined action includes detecting at least one error in the encoded information.

3. The method of claim 1, wherein the predetermined action includes concealing at least one error in the encoded information.

4. The method of claim 1, wherein the predetermined action includes determining a coding rate.

5. The method of claim 1, wherein the predetermined action includes requesting a coding rate.

6. The method of claim 1, wherein the symbols represent unencoded bits produced by the coding scheme.

7. The method of claim 1, further comprising:

performing a sensitivity analysis to assign the symbols to the classes.

8. The method of claim 7, wherein the sensitivity analysis is based on criteria selected from the group consisting of subjective criteria, objective criteria, and a combination of subjective and objective criteria.

9. A method for detecting an error in a plurality of symbols, comprising the steps of:

classifying the symbols into a plurality of classes;

assigning a reliability value to each of the symbols, whereby assigning a plurality of reliability values;

determining a plurality of class reliability values based on the reliability values;

weighting each of the class reliability values with a weighting factor to generate a plurality of weighted class reliability values; and detecting the error based on the weighted class reliability values.

10. The method of claim 9, further comprising:

calculating a total reliability value from the weighted class reliability values;

comparing the total reliability value to a threshold value; and taking a predetermined action when the total reliability value is less than the threshold value.

11. The method of claim 9, wherein the weighting factor indicates the significance of each class in relation to the other classes.

12. The method of claim 9, further comprising:

performing a sensitivity analysis to determine the classes.

13. The method of claim 9, wherein each symbol is a bit.

14. The method of claim 9, further comprising:

calculating a total reliability value from the weighted class reliability values; and taking a predetermined action based on the total reliability value.

15. The method of claim 14, wherein the total reliability value is calculated by summing the class reliability values.

16. The method of claim 14, wherein a weighting factor of zero excludes a class from the total reliability value calculations.

17. An apparatus, comprising:

a first input for receiving a plurality of symbols;

a second input for receiving a plurality of reliability values corresponding to the symbols;

a classifier, operatively coupled to the first input, for associating each of the symbols with one of a plurality of classes;

a look up table for providing a plurality of weighting factors corresponding to the classes;

a weight calculator, operatively coupled to the look up table and the classifier, for determining a plurality of class reliability values and for weighting each of the class reliability values with one of the weighting factors to generate a plurality of weighted class reliability values.

18. The apparatus of claim 17, further comprising:

a decoder, operatively coupled to the second input, for providing the reliability values.

19. The apparatus of claim 18, wherein the decoder is selected from the group consisting of a Viterbi decoder, a Golay decoder a Hamming decoder, a MAP decoder, and a BCJR decoder.

20. A computer-usable media storing a software program for directing a computing device to manage a communication channel by:

receiving a plurality of symbols representing information encoded using a predetermined coding scheme;

receiving a plurality of reliability values corresponding to the symbols;

associating each of the symbols with one of a plurality of predetermined classes;

determining a plurality of class reliability values based on the reliability values;

providing a plurality of predetermined weighting factors corresponding to the classes;

weighting each of the class reliability values with a corresponding one of the predetermined weighting factors to generate a plurality of weighted class reliability values; and taking a predetermined action for managing the communication channel based on at least one of the weighted class reliability values.

21. A method of selecting a channel coding rate in a communication system, comprising:

determining a plurality of class reliability values based on a plurality of symbols and a corresponding plurality of reliability values;

weighting each of the class reliability values with at least one predetermined weighting factor to generate a plurality of weighted class reliability values;

determining a weighted reliability value based on the weighted class reliability values;

estimating a carrier-to-interference (C/I) ratio based on the weighted reliability value; and selecting the channel coding rate based on the estimated C/I ratio.

22. The method of claim 21, further comprising:

filtering the estimated C/I ratio.

23. The method of claim 21, wherein the step of selecting includes comparing the estimated C/I ratio to a table of predetermined thresholds to select the channel coding rate.

24. The method of claim 21, further comprising:

providing a look up table storing a plurality of estimated C/I ratios; and applying the weighted reliability value to the look up table to estimate the C/I ratio.

25. The method of claim 24, further comprising:

interpolating at least two of the estimated C/I ratios.

* * * * *